US009423295B2

(12) United States Patent
Lai et al.

(10) Patent No.: US 9,423,295 B2
(45) Date of Patent: Aug. 23, 2016

(54) PHOTO-SENSOR WITH A TRANSPARENT SUBSTRATE AND AN IN-PLANE ELECTRODE PAIR

(71) Applicant: Agency for Science, Technology and Research, Singapore (SG)

(72) Inventors: Szu Cheng Lai, Singapore (SG); Kui Yao, Singapore (SG); Yi Fan Chen, Singapore (SG); Yee Fun Lim, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 46 days.

(21) Appl. No.: 14/261,269

(22) Filed: Apr. 24, 2014

(65) Prior Publication Data

US 2014/0319317 A1    Oct. 30, 2014

(30) Foreign Application Priority Data

Apr. 24, 2013    (SG) .............................. 201303153-9

(51) Int. Cl.
*G01J 1/42* (2006.01)
*H01L 49/00* (2006.01)
(52) U.S. Cl.
CPC .................. *G01J 1/42* (2013.01); *G01J 1/429* (2013.01); *H01L 49/00* (2013.01)

(58) Field of Classification Search
CPC .................................. G01J 1/42; H01L 49/00
See application file for complete search history.

(56) References Cited

U.S. PATENT DOCUMENTS

| 6,190,728 | B1 * | 2/2001 | Suzuki et al. | 427/126.3 |
| 6,559,471 | B2 * | 5/2003 | Finder et al. | 257/22 |
| 2002/0148964 | A1 * | 10/2002 | Dausch et al. | 250/338.3 |
| 2004/0046123 | A1 * | 3/2004 | Dausch | 250/351 |
| 2004/0106014 | A1 * | 6/2004 | Moon et al. | 428/697 |
| 2006/0183249 | A1 * | 8/2006 | Yao et al. | 438/3 |
| 2009/0072143 | A1 * | 3/2009 | Ishida et al. | 250/338.3 |

* cited by examiner

*Primary Examiner* — Tony Ko
(74) *Attorney, Agent, or Firm* — Schwegman Lundberg & Woessner, P.A.

(57) ABSTRACT

According to one aspect of the invention, there is provided a photo-sensor comprising: an optically transparent substrate; an electrode pair; and a photoactive film with electrical polarization located between the optically transparent substrate and the electrode pair, wherein the optically transparent substrate is configured to transmit incident radiation received by the optically transparent substrate to the photoactive film and wherein the electrode pair is configured to receive charge carriers generated by the photoactive film in response to the transmitted incident radiation.

20 Claims, 8 Drawing Sheets

PHOTO-SENSOR WITH A TRANSPARENT SUBSTRATE AND AN IN-PLANE ELECTRODE PAIR

CLAIM OF PRIORITY

This application claims the benefit of priority of Singapore patent application Ser. No. 201303153-9, entitled "PHOTO-SENSOR," filed on Apr. 24, 2013, the benefit of priority of which is claimed hereby, and which is incorporated by reference herein in its entirety.

FIELD OF INVENTION

The invention relates generally to a photo-sensor.

BACKGROUND

Conventional photo-sensors are typically made of semiconductor materials based on interfacial photovoltaic effects across a p-n junction or Schottky barrier. Such photo-sensors are known to possess numerous drawbacks associated with low photo-voltage, strong temperature dependency of the photocurrent, fast degradation under intense radiation and being expensive to fabricate. In view of these limitations, photo-sensors made of ferroelectrics thin films have been introduced as a promising alternative to their semiconductor counterparts. These sensors are typically based on bulk photovoltaic effect in the ferroelectrics and can be configured to produce large photo-voltage. In addition, ferroelectric oxide materials can be easily fabricated into thin films that possess excellent chemical and thermal stability. These attributes help to realize a robust, durable and low-cost photo-sensor which is highly desired for high intensity optical sensing and monitoring applications.

However, current ferroelectric thin-film photo-sensors are hindered by their low photocurrent magnitude. This is largely due to the high electrical resistivity as well as low optical absorption coefficient of ferroelectric materials. In any of these sensors, it is critical that the ferroelectric bulk is sufficiently exposed to the targeted radiation, so as to optimize the generation of photo-charges and elevate the sensor current output to photo-excitation. However, in current photo-sensors, photo-exposure on the ferroelectric bulk has not been maximized due to the presence of electrodes which impose shading effects on incident radiation.

Prior photo-sensors using ferroelectric thin films typically adopt a multi-layer structure comprising of a top metallic electrode, an electrically polarized ferroelectric thin film, a bottom metallic electrode and silicon (Si) substrate. Light is to pass through the top electrode first before reaching the ferroelectric film for the generation of bulk photovoltaic effect. Since the metallic surfaces of the electrodes are reflective in nature, the intensity of the radiation reaching the underlying ferroelectric bulk region is considerably attenuated. Such electrode shading effect gives rise to sub-optimal photo-excitation and severely impairs the performance of the sensor, including angular dependence and wavelength dependence. To mitigate the effects of electrodes shading, transparent conductive oxides (TCOs) have been deployed as top electrodes in ferroelectric sensors. Unfortunately, TCOs still have limited transparency to certain wavelengths (eg. ultraviolet) and possess much poorer electrical conductivities than metals. In addition, the top-bottom sandwich electrode configuration also has several other drawbacks, such as limited photovoltage magnitude, asymmetric interfacial energy barrier effect and degradation in prolonged intensive light irradiation.

Alternatively, a sensor configuration comprising of in-plane interdigitated metallic electrodes on a ferroelectric thin film may be adopted to improve optical exposure. In such a configuration, the polarization is aligned about in parallel with the surface of the ferroelectric thin film upon which both electrodes are usually deposited. Each electrode typically comprises of multiple fingers interdigitating those of the other electrode with a minute space gap in-between. With this in-plane configuration, the active areas in-between the electrodes are directly exposed to incident radiation. Research results have shown that the in-plane configuration of the ferroelectric photo-sensors have improved stability, durability and photovoltage magnitude. As there is no electrode shading effect on these areas, photon loss is reduced so as to achieve a more efficient photo-excitation with minimized angular dependence. However, the in-plane interdigitated electrodes configuration has yet to optimize optical exposure on the ferroelectric layer as a substantial area of the ferroelectric surface is still covered by the electrodes. These covered surfaces are subjected to sub-optimal optical exposure as a result of electrodes shading effects. In addition, the photovoltaic ferroelectric thin films may be exposed to moisture, contamination and mechanical scratches, which affect operation reliability and damages the ferroelectric layer.

There is thus a need to address the above drawbacks for existing photo-sensors.

SUMMARY

According to one aspect of the invention, there is provided a photo-sensor comprising: an optically transparent substrate; an electrode pair; and a photoactive film with electrical polarization located between the optically transparent substrate and the electrode pair, wherein the optically transparent substrate is configured to transmit incident radiation received by the optically transparent substrate to the photoactive film and wherein the electrode pair is configured to receive charge carriers generated by the photoactive film in response to the transmitted incident radiation.

According to another aspect of the invention, there is provided a photo-sensor package comprising: an optically transparent substrate; an electrode pair; and a photoactive film with electrical polarization disposed between the optically transparent substrate and the electrode pair, wherein the optically transparent substrate is configured to transmit incident radiation received by the optically transparent substrate to the photoactive film and wherein the electrode pair is configured to receive charge carriers generated by the photoactive film in response to the transmitted incident radiation.

BRIEF DESCRIPTION OF THE DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which.

DETAILED DESCRIPTION

In the following description, various embodiments are described with reference to the drawings, where like reference characters generally refer to the same parts throughout the different views.

Figure 1:
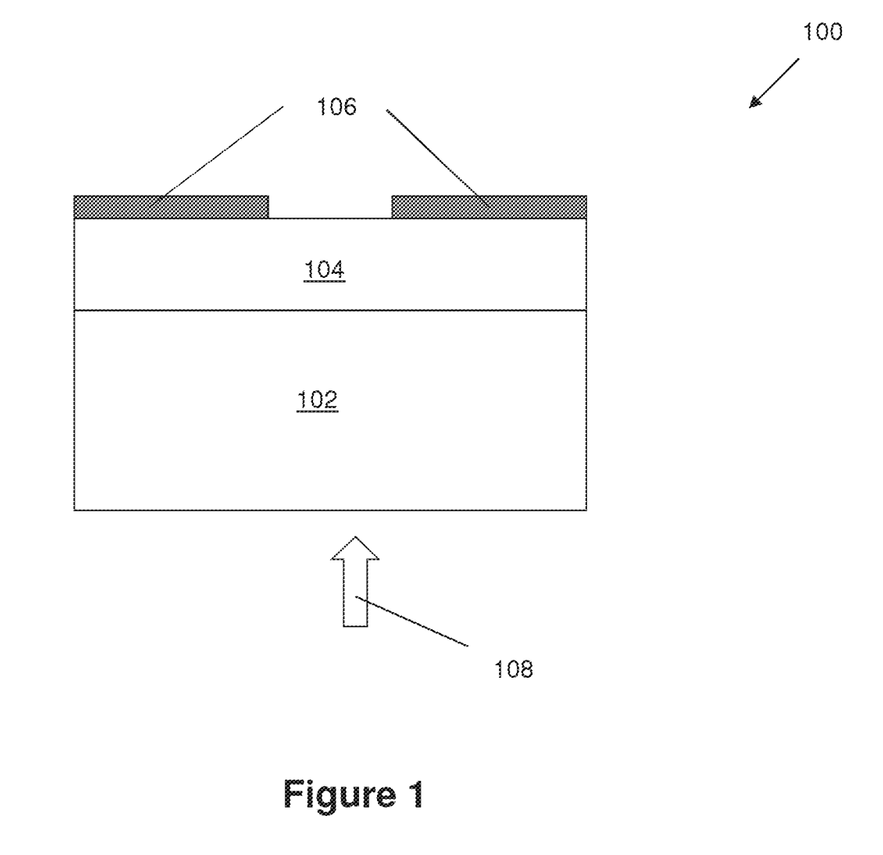
FIG. 1 shows a cross-section structure of a photo-sensor according to a first embodiment of the invention.

FIG. 1 shows a cross-section structure of a photo-sensor 100 according to a first embodiment of the invention. The photo-sensor 100 has an optically transparent substrate 102, a photoactive film 104 with electrical polarization and an electrode pair 106. The photoactive film 104 has been configured so that its electrical polarization is inherent to the photoactive film 104. The electrical polarization may be established by applying an electric field on the photoactive film 104 via applying a potential difference across the electrode pair 106. In this way, the orientation of the electrical polarization in the photoactive film 104 is such that it is in a direction that is parallel to a plane along which the optically transparent substrate 102 lies. The photoactive film 104 is located between the optically transparent substrate 102 and the electrode pair 106. The electrode pair 106 is configured to receive charge carriers generated by the photoactive film 104 in response to incident radiation 108 transmitted by the optically transparent substrate 102.

The optically transparent substrate 102 and the photoactive film 104 are in contact, although in another embodiment (see the third embodiment shown in FIG. 3A), one or more layers may be present between the optically transparent substrate 102 and the photoactive film 104. It is preferable for the electrode pair 106 to be in contact with the photoactive film 104, as shown in the first embodiment, although in another embodiment (not shown), one or more layers may be present between the electrode pair 106 and the photoactive film 104. In such an embodiment, these one or more layers are thin and fabricated from conductive material.

The optically transparent substrate 102 is configured to transmit incident radiation 108 received by the optically transparent substrate 102 to the photoactive film 104. Such a configuration has the optically transparent substrate 102 disposed before the photoactive film 104 with respect to an optical path taken by the incident radiation 108 on the photo-sensor 100. With the electrode pair 106 located on the surface of the photoactive film 104 opposite to the surface of the photoactive film 104 that is in contact with the optically transparent substrate 102, the electrode pair 106 does not obstruct the incident radiation 108 that transmits from the optically transparent substrate 102 into the photoactive film 104. This addresses the problem of sub-optimal optical exposure of the active area/region (i.e. the photoactive film 104). Sub-optimal optical exposure of the active region, which is especially present in photo-sensors having electrodes that shade incident radiation, gives rise to low photovoltaic response.

In the deployment of the photo-sensor 100, light penetrates through the optically transparent substrate 102, reaching the photoactive film 104 next, and then the electrode pair 106 last. The full area of the photoactive film 104 is subjected to radiation without the attenuating effects imposed by the electrode pair 106 so as to maximize optical exposure. In addition, the photovoltaic photoactive film 104 is not exposed to moisture, contamination and mechanical scratches, from being protected by the relatively thicker optically transparent substrate 102.

The photoactive film 104 preferably comprises a ferroelectric. A ferroelectric thin film possesses strong tolerance to intense radiation. In addition, the electrode pair 106, which may be realised by two separate electrodes that are electrically isolated from each other, is preferably planar. Further, the electrode pair 106 is parallel to a plane along which the photoactive film 104 lies. This planar arrangement confines the electrode pair 106 on a same surface of the photo-sensor 100, in contrast to other photo-sensor arrangements where each electrode in its electrode pair is provided on separate surfaces. In addition, such a planar arrangement provides an in-plane polarized ferroelectric photoactive film 104, which improves performance, stability, durability, and photovoltage magnitude. The electrical polarization of the ferroelectric photoactive film 104 is orientated on a plane that is generally parallel to a plane along which the optically transparent substrate 102 lies. The ferroelectric photoactive film 104 can be electrically polarized by applying an electric field across the in-plane electrode pair 106.

The photo-sensor 100 arrangement of the first embodiment, comprising a transparent substrate, an in-plane electrically polarized ferroelectric thin film over the transparent substrate and an in-plane electrode pair over the ferroelectric thin film is present in various embodiments of the invention, such as the second and third embodiments of the invention, which are described below.

Figure 2A:
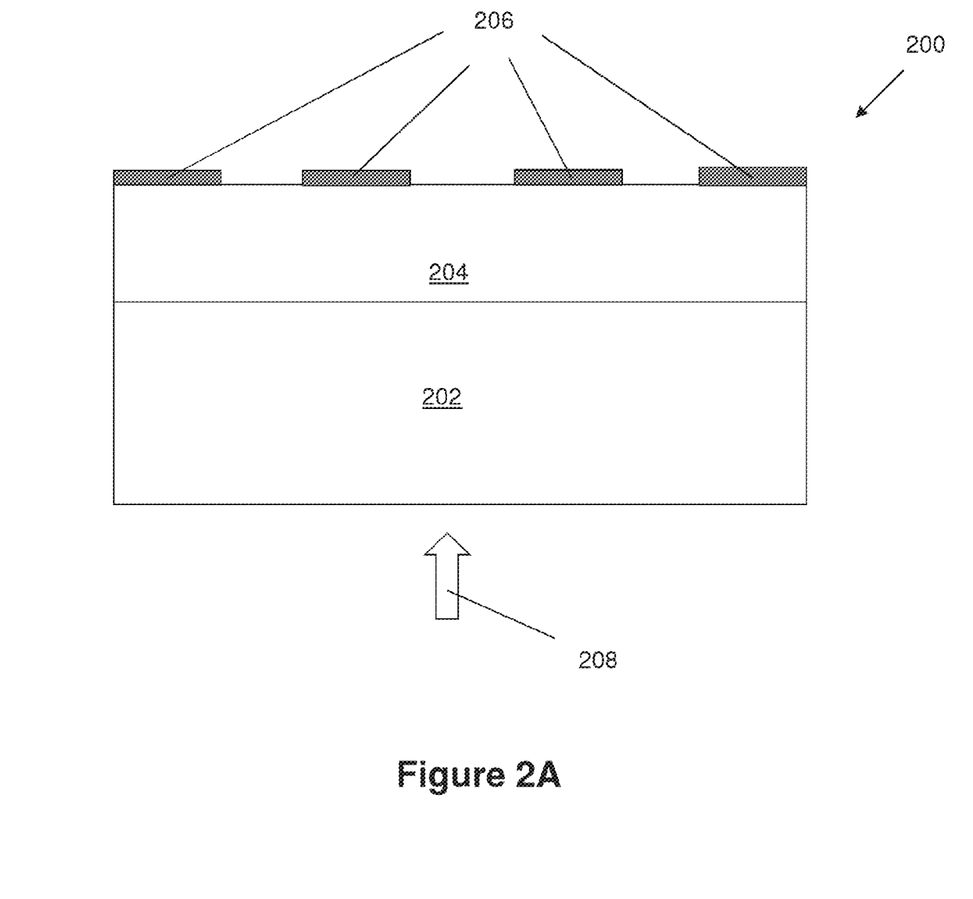
FIG. 2A shows a cross-section structure of a photo-sensor according to a second embodiment of the invention.

FIG. 2A shows a cross-section structure of a photo-sensor 200 according to a second embodiment of the invention.

Figure 2B:
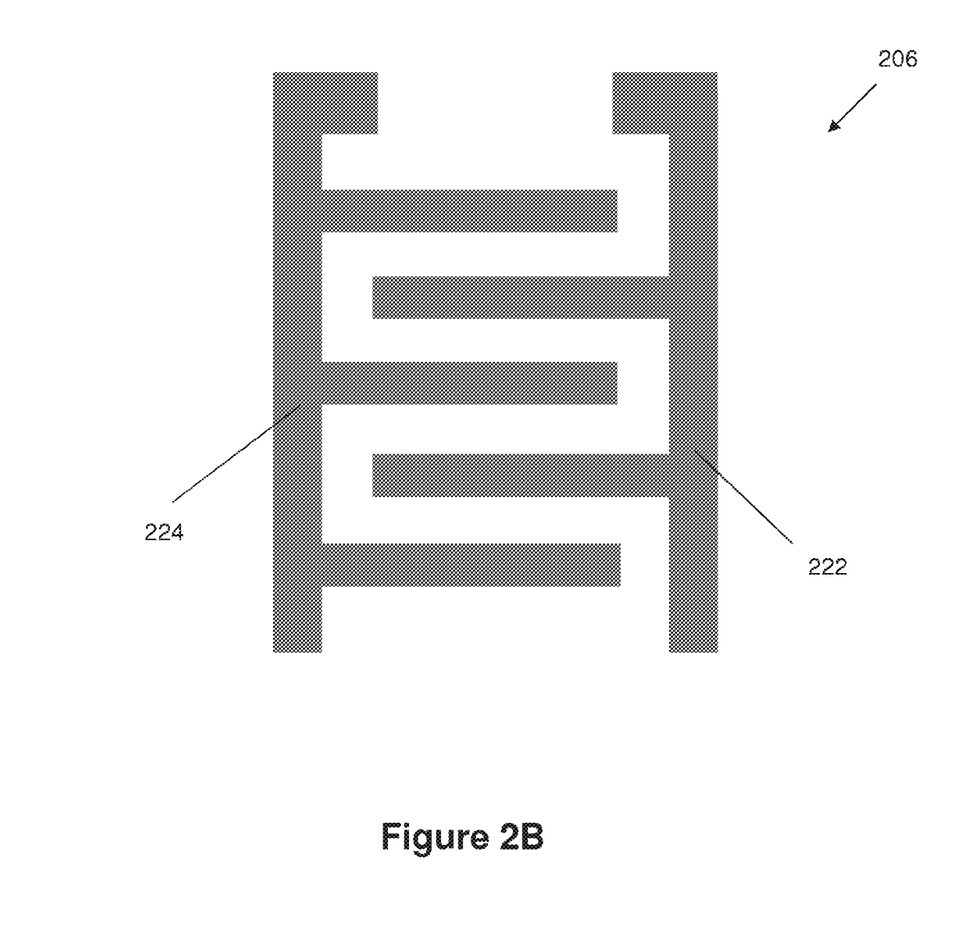
FIG. 2B shows a top view of the photo-sensor of FIG. 2A.

The photo-sensor 200 has an optically transparent substrate 202, a ferroelectric photoactive film 204 with electrical polarization and an electrode pair 206 that may be realised by two interdigitated electrodes 222 and 224 (see FIG. 2B). The ferroelectric photoactive film 204 has been configured so that its electrical polarization is inherent to the ferroelectric photoactive film 204. The electrical polarization may be established by applying an electric field on the ferroelectric photoactive film 204 via applying a potential difference across the electrode pair 206. In this way, the orientation of the electrical polarization in the ferroelectric photoactive film 204 is such that it is in a direction that is parallel to a plane along which the optically transparent substrate 202 lies. The ferroelectric photoactive film 204 is located between the optically transparent substrate 202 and the electrode pair 206. The electrode pair 206 is configured to receive charge carriers generated by the ferroelectric photoactive film 204 in response to incident radiation 208 transmitted by the optically transparent substrate 202. The electrode pair 206 is able to receive such charge carriers from being in contact with the photoactive film 204. The optically transparent substrate 202 and the ferroelectric photoactive film 204 are also in contact.

The optically transparent substrate 202 is configured to transmit the incident radiation 208 received by the optically transparent substrate 202 to the ferroelectric photoactive film 204.

FIG. 2B shows a top view of the photo-sensor 200 of FIG. 2A, where only the electrode pair 206 is shown, for the purposes of simplicity. As mentioned above, the electrode pair 206 may be realised by two interdigitated electrodes 222 and 224. The in-plane electrode pair 106 adopting an interdigitated pattern, as shown in FIGS. 2A and 2B, facilitates poling over the surface of the ferroelectric photoactive film 204. In this way, a depolarization field is established in the ferroelectric thin film in a direction parallel to a plane along which the main surface of the optically transparent substrate 202 lies. Under the effect of photo-excitation, holes and electrons, created from photons in the incident radiation 208 that are absorbed by the ferroelectric photoactive film 204, are separated along the direction of the depolarization field and collected by the electrode pair 206.

It is preferred that the in-plane electrode pair 206 is made of metal with good reflective surfaces. Alternatively, at least a surface of the electrode pair 206 that faces the ferroelectric photoactive film 204 is reflective. In this way, some of the unabsorbed photons which pass through the ferroelectric photoactive film 204 can be reflected back into the ferroelectric photoactive film 204 again by the surfaces of the electrode pair 206. As a result, the travelling distance of the photon in the ferroelectric photoactive film 204 can be substantially increased to facilitate its absorption by the bulk of the ferroelectric photoactive film 204. As photon absorption becomes more efficient, the generation of photo-charges is elevated to achieve a higher photocurrent response.

Figure 3A:
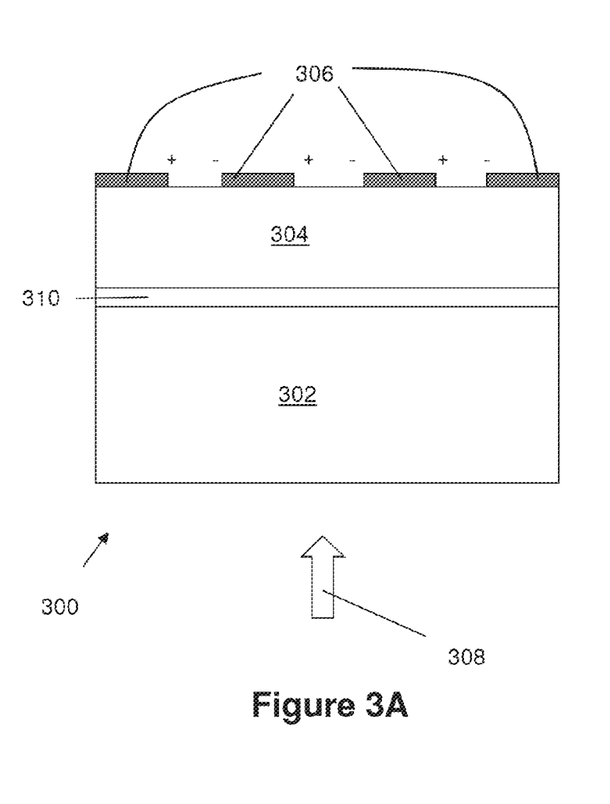
FIG. 3A shows a cross-section structure of a photo-sensor according to a third embodiment of the invention.

FIG. 3A shows a cross-section structure of a photo-sensor 300 according to a third embodiment of the invention.

The photo-sensor 300 has an optically transparent substrate 302, a ferroelectric photoactive film 304 with electrical polarization and an electrode pair 306. The ferroelectric photoactive film 304 has been configured so that its electrical polarization is inherent to the ferroelectric photoactive film 304. The electrical polarization may be established by applying an electric field on the ferroelectric photoactive film 304 via applying a potential difference across the electrode pair 306. In this way, the orientation of the electrical polarization in the ferroelectric photoactive film 304 is such that it is in a direction that is parallel to a plane along which the optically transparent substrate 302 lies. Similar to the photo-sensor 200 of FIGS. 2A and 2B, the photo-sensor 300 uses interdigitated electrodes 322 and 324 (see FIG. 3B) for the electrode pair 306. The ferroelectric photoactive film 304 is located between the optically transparent substrate 302 and the electrode pair 306. The electrode pair 306 is configured to receive charge carriers generated by the ferroelectric photoactive film 304 in response to incident radiation 308 transmitted by the optically transparent substrate 302, preferably from being in contact with the photoactive film 304, as shown in FIG. 3A. The optically transparent substrate 302 is configured to transmit the incident radiation 308 received by the optically transparent substrate 302 to the ferroelectric photoactive film 304.

In contrast to the photo-sensor 100 of FIG. 1 and the photo-sensor 200 of FIGS. 2A and 2B, the photo-sensor 300 has a further layer, namely a buffer layer 310. The buffer layer 310 is disposed between the optically transparent substrate 302 and the ferroelectric photoactive film 304. Thus, the optically transparent substrate 302 and the ferroelectric photoactive film 304 are not in contact with each other. The buffer layer 310 may be made of insulator that comprises any one or more of the following: yttria-stabilized zirconia (YSZ), strontium titanate ($SrTiO_3$) and magnesium oxide (MgO), and is for the purpose of facilitating the fabrication process of the ferroelectric photoactive film 304.

The optically transparent substrate 302 may be a fused silica substrate, the ferroelectric photoactive film 304 may be fabricated from a thin film of $Pb_{0.97}La_{0.03}(Zr_{0.52}Ti_{0.48})O_3$ (PLZT) with thicknesses preferably in the range of hundreds of nanometer to a few micrometer, and a pair of in-plane interdigitated gold (Au) electrodes may be used to realise the electrode pair 306.

Figure 3B:
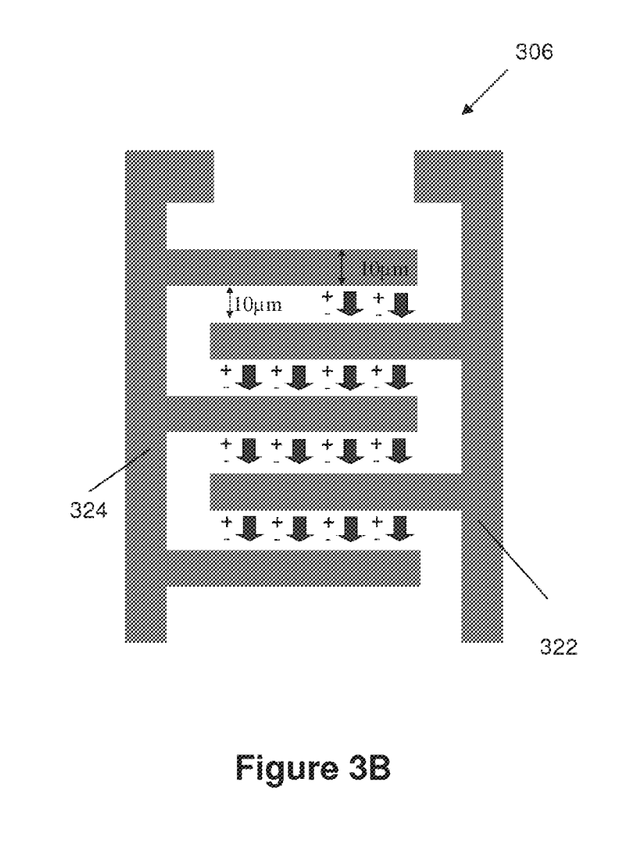
FIG. 3B shows a top view of the photo-sensor of FIG. 3A.

FIG. 3B shows a top view of the photo-sensor 300 of FIG. 3A, where only the electrode pair 306 is shown, for the purposes of simplicity. As mentioned above, the electrode pair 306 may be realised by two interdigitated electrodes 322 and 324.

Each electrode 322 and 324 may have multiple fingers interdigitating with those of the other electrode, leaving a 10 µm space gap between the adjacent fingers. The ferroelectric photoactive film 304 is electrically polarized by applying a voltage across the electrodes 322 and 324 so as to establish a depolarization field in the bulk of the ferroelectric photoactive film 304 for separating the holes and electrons generated by photo-excitation in the ferroelectric photoactive film 304.

In one implementation, the ferroelectric photoactive film 304 may be operated to produce a photovoltaic output in response to UVA wavelengths (ultraviolet radiation of wavelength 320-420 nm), where the silica optically transparent substrate 302 is largely transparent to wavelength of the same spectrum. Under this operation, a photo-sensor is achieved, which is capable of receiving UVA radiation and producing current that linearly increases with the UVA photo-intensity.

By using a transparent substrate, the various embodiments described above realise a more robust sensor and renders the device packaging process simple and cost-effective. The transparent substrate itself can provide encapsulation to the sensing area (i.e. the photoactive film) of the packaged photo-sensor, so that an additional protective glass window used in most conventional photo-sensors becomes redundant. For this, a photo-sensor according to any of the above embodiments may adopt a flip-chip connection as follows. Contact pads (associated with each electrode in the electrode pair), which are fabricated in-plane with the electrode pair, for charge collection are pre-deposited with solder bumps. The photo-sensor is flipped over to have the electrode pair face a surface of the package substrate, so that the back surface of the transparent substrate (i.e. the surface of the transparent substrate opposite to the surface that faces the photoactive film) forms the optical window of the packaged photo-sensor.

Figure 4:
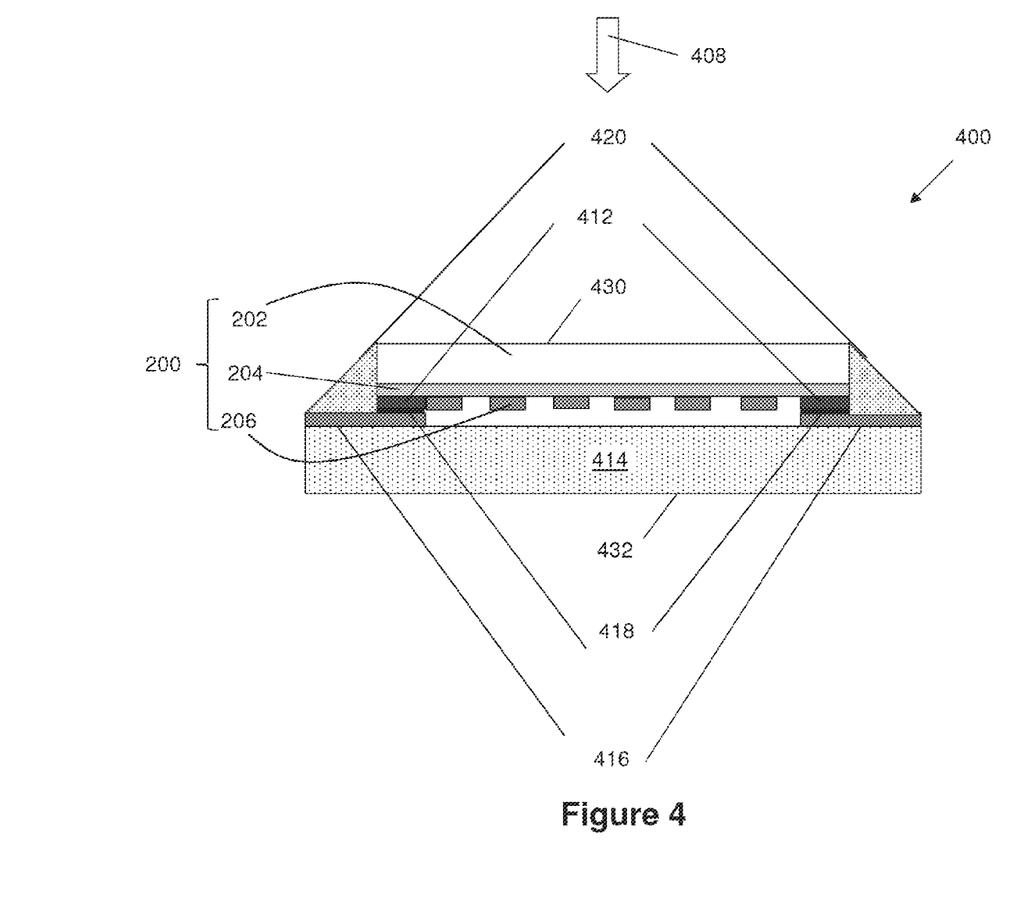
FIG. 4 shows a cross-section structure of a photo-sensor package that contains a photo-sensor that is in accordance with the second embodiment of the invention.

FIG. 4 shows a cross-section structure of a photo-sensor package 400 that contains a photo-sensor that is in accordance with one embodiment of the invention.

The photo-sensor package 400 may be fabricated from applying the flip-chip connection described above on the photo-sensor 200 that is in accordance with the second embodiment of the invention (see FIG. 2). Accordingly, the photo-sensor 200 in the photo-sensor package 400 has an optically transparent substrate 202; a photoactive film 204 with electrical polarization and an electrode pair 206. The photoactive film 204 is located between the optically transparent substrate 202 and the electrode pair 206. The electrode pair 206 is configured to receive charge carriers generated by the photoactive film 204 in response to incident radiation 408 transmitted by the optically transparent substrate 202. The electrode pair 206 is in contact with the photoactive film 204. The optically transparent substrate 202 and the photoactive film 204 are also in contact. The optically transparent substrate 202 is configured to transmit incident radiation 408 received by the optically transparent substrate 202 to the photoactive film 204.

The photo-sensor package 400 further has package substrate 414 that is disposed to face the electrode pair 206, so that each of the optically transparent substrate 202 and the package substrate 414 provides an external surface (labeled 430 and 432 respectively) of the photo-sensor package 400. The external surface 430 provided by the optically transparent substrate 202 is opposite to the external surface 432 provided by the package substrate 414. The package substrate 414 includes at least one contact pad 416 to which at least one of the electrode pair 206 is coupled. In assembling the photo-sensor 200, in accordance with the second embodiment of the invention, to form the photo-sensor package 400, contact pads 412 of the electrode pair 206 are aligned with the corresponding contact pads 416 of the package substrate 414 for external circuit connection. Pre-deposited solder bumps 418 are melted to establish the electrical connection between the pads (412 and 416) in contact.

Epoxy adhesive materials may further be applied along the edges of the sensor to serve as hermetic sealant 420 bonding the photo-sensor 200 to the package substrate 414 of the photo-sensor package 400. The sealant 420 may be disposed along a perimeter of the optically transparent substrate 202, the electrode pair 206 and the photoactive film 204. Being protected by the transparent substrate 202 and hermetically sealed in flip-chip packaging, the ferroelectric photoactive film 204 becomes highly resistant to physical scratches, moisture and contamination degradation. Due to the simplicity of the packaging process, the production cost of the photo-sensor package 400 can be lowered, thus enhancing price competitiveness of the final product.

The ferroelectric used to fabricate the photoactive film 104, 204 and 304 is not confined to La-doped lead zirconate titanate (PLZT), but may include any other ferroelectrics exhibiting photovoltaic response under radiation of intended wavelength. These ferroelectric materials may include lithium niobate ($LiNbO_3$), barium titanate ($BaTiO_3$) and bismuth ferrite ($BiFeO_3$). Likewise, the electrode pair 106, 206 and 306 may not be confined to metal such as gold, but may also include any other metals, such as chromium (Cr), silver (Ag), platinum (Pt), aluminum (Al), or multiple layers of different metals. The electrode pair 106, 206 and 306 may not be even confined to metals but may also include any other form of electrically conductive non-metal materials, such as $(La_{0.7}Sr_{0.3})MnO_3$ (LSMO) and Nb-doped $SrTiO_3$ (Nb:STO), and other metal oxides and ceramics. In cases where the electrode pair 106, 206 and 306 is made of metal-oxides or ceramics, it is preferred that the material possesses a high dielectric constant to distribute the polarization screening charges more extensively away from the electrode-ferroelectric interface and realize a greater depolarization field. The electrode pair 106, 206 and 306 may also be made of different materials rather than of the same material. The electrode pair 106, 206 and 306 may not be confined to interdigitating configuration, but any other patterns as long as sufficient space gaps exist between the electrodes for the establishment of the depolarization field. In addition, the substrate 102, 202 and 302 may not be confined to fused silica, but include all kinds of glasses (such as amorphous or crystalline), polymers or any other materials transparent to the intended radiations such as magnesium oxide (MgO) and strontium titanate ($SrTiO_3$). The substrate 102, 202 and 302 may also be a single-crystal material as in the case of MgO and is preferably lattice-matched to the photoactive film 104, 204 and 304, so as to allow epitaxial growth of the photoactive film 104, 204 and 304.

The following describes one way to fabricate the photo-sensor 300 of the third embodiment as shown in FIG. 3. A 200-nm-thick YSZ buffer layer 310 is first fabricated on an optically transparent fused silica substrate 308 by repetitive spin-coating of YSZ precursor chemical solution, followed by a pyrolysis process at 430° C. The YSZ buffer layer 310 is then annealed at 700 to 775° C. A 1.2-μm-thick PLZT photoactive film 304 is then developed on the YSZ buffer layer 310 using a sol-gel method, in which a PLZT precursor solution is deposited by spin-coating process, followed by pyrolysis. The film after the pyrolysis is annealed at 700° C. The metallic electrode pair 306 is then developed by depositing chromium (Cr), followed by gold (Au) on the PLZT photoactive film 304 surface to form an interdigitated pattern, as shown in FIG. 3B.

The feasibility of the photo-sensor 300, fabricated as described above, for photo-sensing of UVA was then tested, as described below, to characterize the sensor. The PLZT photoactive film 304 was electrically poled by applying a voltage across the electrodes' contact points using a source-meter.

Figure 5:
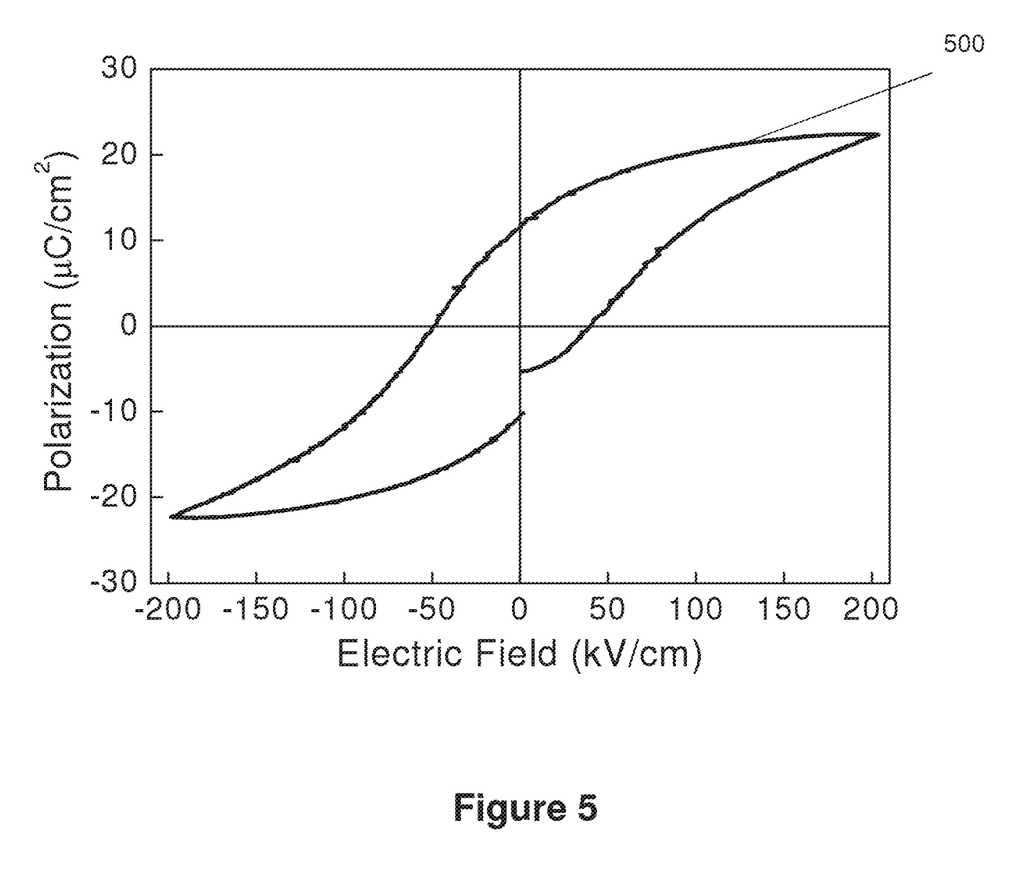
FIG. 5 shows a ferroelectric hysteresis loop of the PLZT photoactive film in a photo-sensor fabricated in accordance with the third embodiment of the invention.

The ferroelectric hysteresis loop 500 of the PLZT photoactive film 304 was measured with a standard ferroelectric testing system and the result is shown in FIG. 5. It is noted that the PLZT photoactive film 304 exhibited a remnant polarization of 11.8 $\mu Ccm^{-2}$, indicating that electrical polarization can be substantially induced in the ferroelectric thin film along the plane of the optically transparent substrate 302 surface.

The spectral response (SR) of the photo-sensor 300 surfaces pertaining to the optically transparent substrate 302 (denoted as the back surface, i.e. the surface of the optically transparent substrate 302 that is opposite to the one facing the YSZ buffer layer 310) and the electrode pair 306 (denoted as the front surface, i.e. the surface of the electrode pair 306 that is opposite to the one facing the photoactive film 304) were measured under a standard setup comprising of a xenon lamp, a mono-chromator and an electrometer. The SR curves obtained were normalized to their respective peak values and plotted in FIG. 6. Curve 602 shows the SR at the back surface and curve 606 shows the SR at the front surface.

Figure 6:
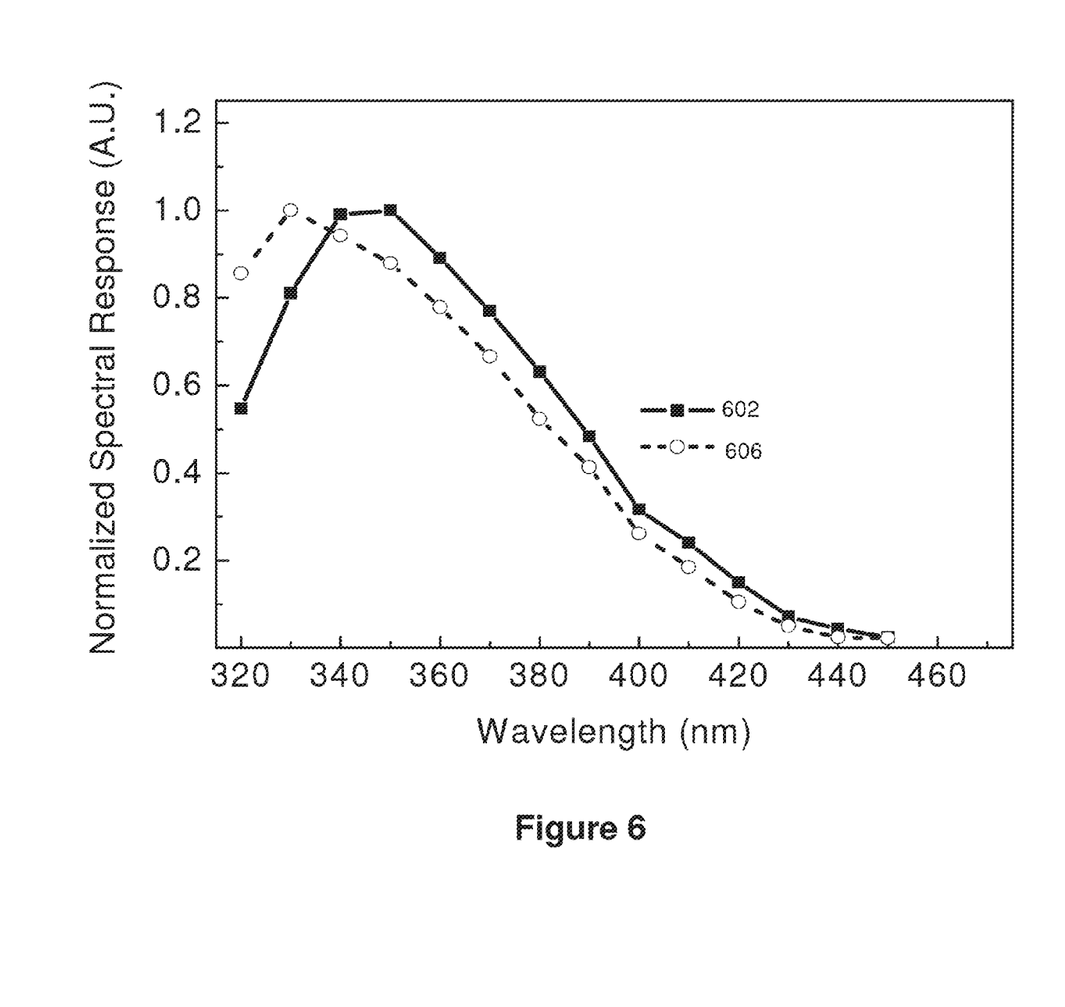
FIG. 6 shows spectral response in UVA region (ultraviolet radiation of wavelength 320-420 nm) of the back and front surfaces of a photo-sensor fabricated in accordance with the third embodiment of the invention.

From the curves 602 and 606 in FIG. 6, it can be observed that both the back and front surfaces are responsive to the full UVA spectrum of 320-400 nm and have similar spectral response profiles. Furthermore, both surfaces exhibit high UV selectivity with very low photovoltaic responses to wavelengths above 400 nm. There is a slight shift in the SR peak which can be attributed to the optically transparent substrate 302 attenuation effects on shorter wavelength. The results indicate that the spectral response would not be significantly distorted by having the radiation penetrate through the optically transparent substrate 302 prior to reaching the photoactive film 304.

Figure 7:
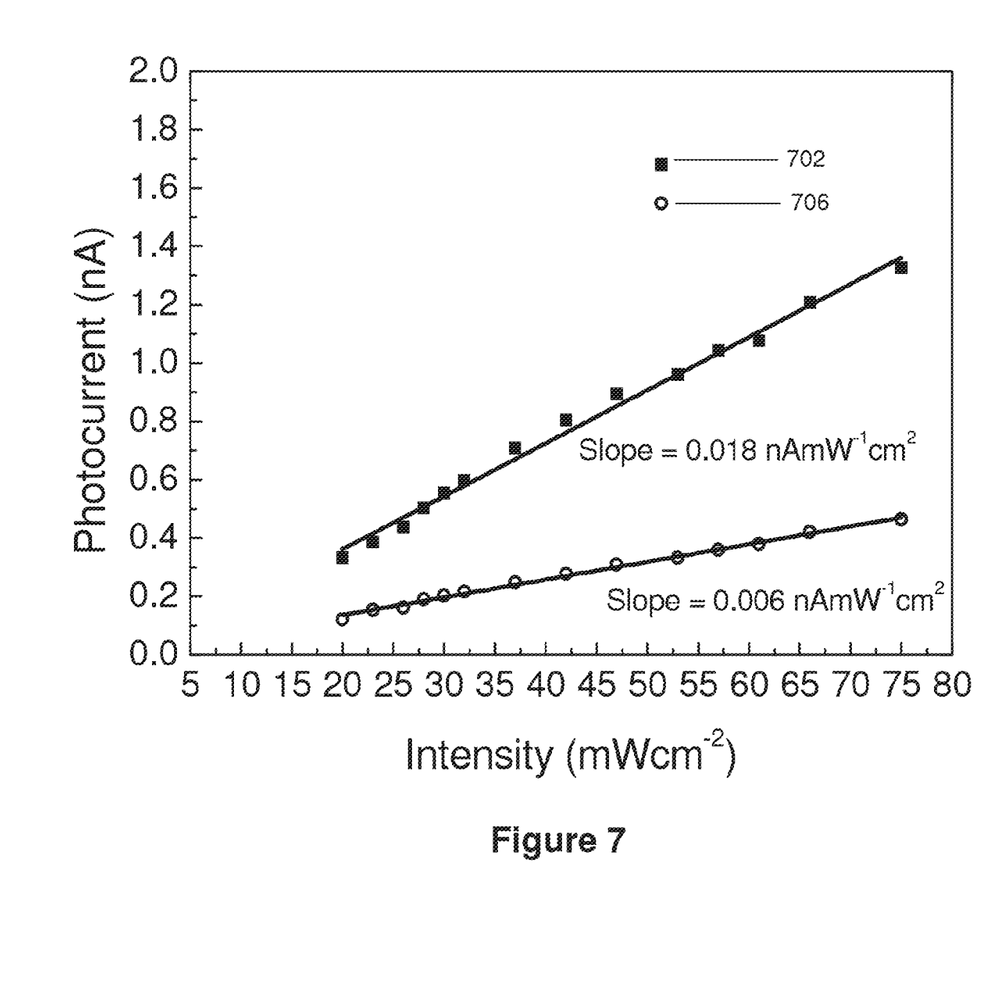
FIG. 7 shows photocurrent response of the back and front surfaces of a photo-sensor fabricated in accordance with the third embodiment of the invention.

The photocurrent response corresponding to the incident radiation falling on the optically transparent substrate 302 surface (i.e. the back) of the photo-sensor 300 and the electrode pair 306 surface (i.e. the front) were measured with an electrometer under an adjustable mercury-xenon lamp, and the results are plotted in FIG. 7. Curve 702 shows the photocurrent response at the back surface and curve 706 shows the photocurrent response at the front surface.

It is observed that the back surface exhibits a higher photocurrent response, which is about 3 times than that of the front surface. The improvement is ascribed to full optical exposure of the photoactive film 304 and the electrode pair 306 reflecting unabsorbed photon back again into the active photoactive film 304.

The various embodiments of the present invention make use of an optically transparent substrate to allow full-area optical exposure on a ferroelectric thin photoactive film with in-plane polarization provided by an electrode pair in a planar configuration. By projecting the radiation from the back of the substrate, the in-plane electrode pair not only avoids shading the thin photoactive film, but further enhances the optical exposure by means of back reflection. As shown in the results of FIGS. 6 and 7, a photo-sensor is provided that provides an improvement in photo-current response, while retaining the spectral response profile of the thin photoactive film. In addition, when applying a flip-chip method to package the photo-sensor, the thin photoactive film is not exposed to moisture, contamination and mechanical scratches from the protection provided by the relatively thicker and physically robust optically transparent substrate. Thus, the photoactive film is encapsulated using the optically transparent substrate itself. This simplifies the packaging process, compared to photo-sensors which require additional optical windows to encapsulate their sensing areas. A simpler packaging process, in turn, addresses cost issues of photo-sensor production. Thus, in addition to improving sensing performance, the photo-sensor device, according to various embodiments of the present invention, can be packaged using a low cost process. Accordingly, various embodiments of the present invention seek to address the industrial need for a more robust and durable photo-sensor to replace photo-sensors which are unsuitable for high intensity applications. Exemplary Industrial applications that require monitoring of strong radiation include:

UV epoxy curing
UV disinfectant
Photo-assisted plant growth stimulation
UV radiation monitoring for health care under sunlight It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

What is claimed is:

1. A photo-sensor comprising:
    an optically transparent substrate;
    an in-plane electrode pair; and
    a photoactive film with electrical polarization located between the optically transparent substrate and the in-plane electrode pair, wherein the optically transparent substrate is configured to transmit incident radiation received by the optically transparent substrate to the photoactive film and wherein the in-plane electrode pair is configured to receive charge carriers generated by the photoactive film in response to the transmitted incident radiation.

2. The photo-sensor of claim 1, wherein the photoactive film comprises a ferroelectric.

3. The photo-sensor of claim 2, wherein the ferroelectric comprises any one or more of: La-doped lead zirconate titanate (PLZT), lithium niobate ($LiNbO_3$), barium titanate ($BaTiO_3$) and bismuth ferrite ($BiFeO_3$).

4. The photo-sensor of claim 2, wherein the electrical polarization of the ferroelectric photoactive film is orientated on a plane that is generally parallel to a plane along which the optically transparent substrate lies.

5. The photo-sensor of claim 1, further comprising an insulative buffer layer disposed between the optically transparent substrate and the photoactive film.

6. The photo-sensor of claim 5, wherein the insulative buffer layer comprises any one or more of: yttria-stabilized zirconia (YSZ), strontium titanate ($SrTiO_3$), and magnesium oxide (MgO).

7. The photo-sensor of claim 1, wherein the in-plane electrode pair is planar and parallel to a plane along which the photoactive film lies.

8. The photo-sensor of claim 1, wherein the in-plane electrode pair comprises two interdigitated electrodes.

9. The photo-sensor of claim 1, wherein the in-plane electrode pair comprises metal or electrically conductive non-metal.

10. The photo-sensor of claim 9, wherein the metal comprises any one or more of:
    gold (Au), silver (Ag), chromium (Cr), aluminum (Al) and platinum (Pt).

11. The photo-sensor of claim 9, wherein the electrically conductive non-metal comprises any one or more of: metal oxides and ceramics.

12. The photo-sensor of claim 11, wherein the electrically conductive non-metal comprises any one or more of: ($La_{0.7}Sr_{0.3}$)$MnO_3$ (LSMO) and Nb-doped $SrTiO_3$ (Nb:STO).

13. The photo-sensor of claim 1, wherein at least a surface of the in-plane electrode pair that faces the photoactive film is reflective.

14. The photo-sensor of claim 1, wherein the optically transparent substrate comprises fused silica, amorphous glass, crystalline glass and polymer.

15. The photo-sensor of claim 1, wherein the optically transparent substrate is fabricated from a single crystal that is lattice-matched to the photoactive film.

16. The photo-sensor of claim 15, wherein the single crystal comprises any one or more of: magnesium oxide (MgO) and strontium titanate ($SrTiO_3$).

17. A photo-sensor package comprising:
    an optically transparent substrate;
    an in-plane electrode pair; and
    a photoactive film with electrical polarization disposed between the optically transparent substrate and the in-plane electrode pair, wherein the optically transparent substrate is configured to transmit incident radiation received by the optically transparent substrate to the photoactive film and wherein the in-plane electrode pair is configured to receive charge carriers generated by the photoactive film in response to the transmitted incident radiation.

18. The photo-sensor package of claim 17, further comprising package substrate disposed to face the in-plane electrode pair, so that each of the optically transparent substrate and the package substrate provide an external surface of the photo-sensor package.

19. The photo-sensor package of claim 18, wherein the package substrate comprises at least one contact pad to which at least one electrode of the in-plane electrode pair is coupled.

20. The photo-sensor package of claim 17 further comprising sealant disposed along a perimeter of the optically transparent substrate, the in-plane electrode pair and the photoactive film.

* * * * *